United States Patent
Vashchenko et al.

(10) Patent No.: US 6,822,294 B1
(45) Date of Patent: Nov. 23, 2004

(54) HIGH HOLDING VOLTAGE LVTSCR

(75) Inventors: Vladislav Vashchenko, Fremont, CA (US); Ann Concannon, San Jose, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/896,681

(22) Filed: Jun. 29, 2001

(51) Int. Cl.[7] .................. H01L 23/62; H01L 31/107
(52) U.S. Cl. ............. 257/355; 257/603; 257/168; 361/54; 361/56; 361/111
(58) Field of Search ................ 257/355, 603, 257/168, 107, 124, 125, 173, 356; 361/54, 56, 111

(56) References Cited

U.S. PATENT DOCUMENTS

| | | | | |
|---|---|---|---|---|
| 5,728,612 A | * | 3/1998 | Wei et al. ................ 438/200 |
| 5,932,916 A | * | 8/1999 | Jung ....................... 257/355 |
| 5,945,713 A | * | 8/1999 | Voldman .................. 257/355 |
| 6,249,414 B1 | * | 6/2001 | Lee et al. ................. 361/111 |
| 6,281,527 B1 | * | 8/2001 | Chen ........................ 257/168 |
| 6,355,959 B1 | * | 3/2002 | Vashchenko et al. ...... 257/355 |
| 6,548,868 B1 | * | 4/2003 | Tsuei et al. ............... 257/355 |

* cited by examiner

Primary Examiner—Jerome Jackson
Assistant Examiner—Joseph Nguyen
(74) Attorney, Agent, or Firm—Jurgen Vollrath

(57) ABSTRACT

In an ESD protection device using a LVTSCR-like structure, the holding voltage is increased by placing the p+ emitter outside the drain of the device, thereby retarding the injection of holes from the p+ emitter. The p+ emitter may be implemented in one or more emitter regions formed outside the drain. The drain is split between a n+ drain and a floating n+ region near the gate to avoid excessive avalanche injection and resultant local overheating.

6 Claims, 5 Drawing Sheets

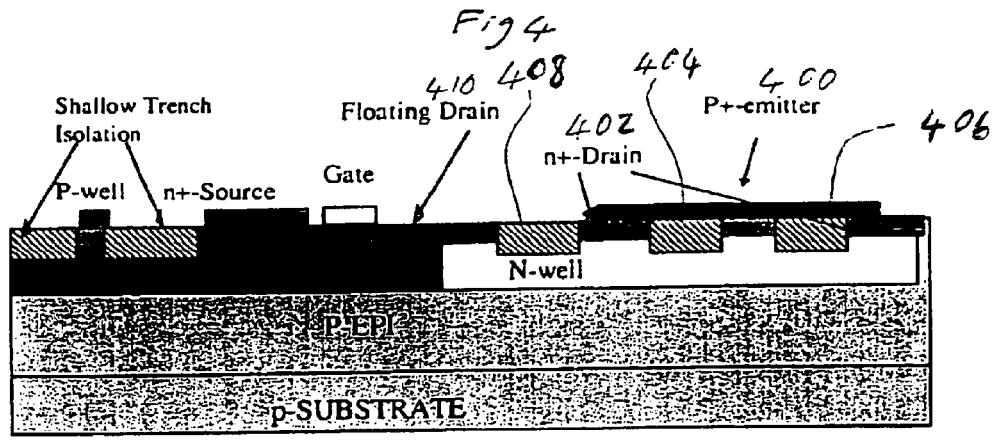
Fig 4
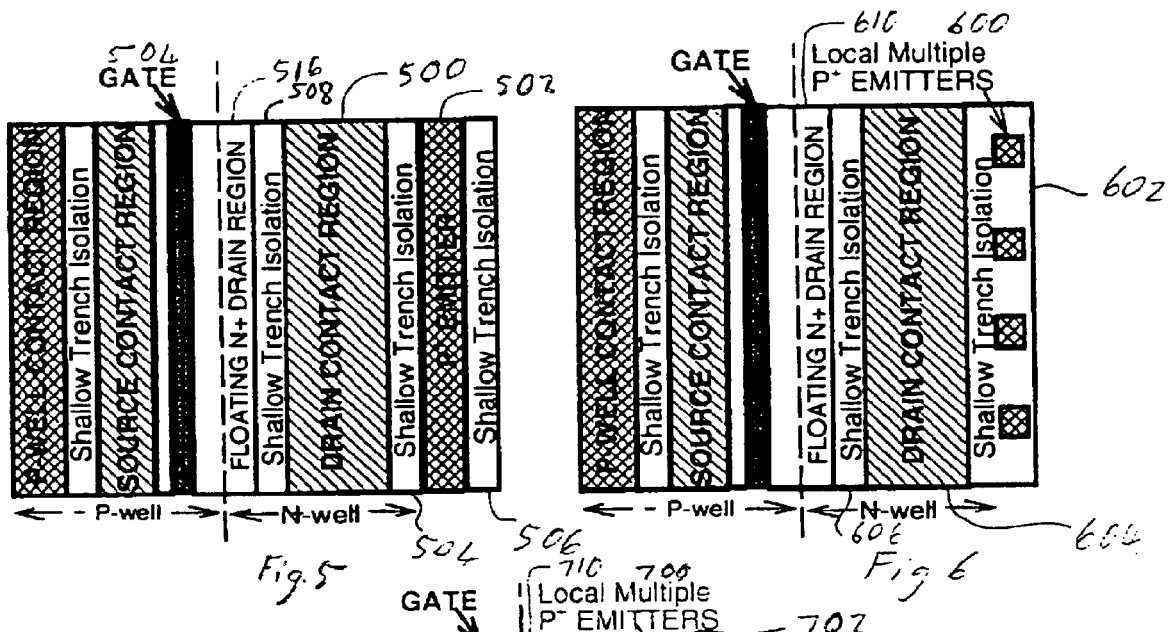
Fig 5
Fig 6
Fig 7

HIGH HOLDING VOLTAGE LVTSCR

FIELD OF THE INVENTION

The invention relates to ESD protection devices. More particularly, it relates to LVTSCR-like devices for protecting CMOS and Bi-CMOS integrated circuits against electrostatic discharge and electrical overstress.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

One of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. Thus, the clamp must be designed so as to be activated below the breakdown voltage of the circuit that is to be protected. At the same time, the latch-up or holding voltage must exceed the normal operating voltage of the protected circuit.

Some protection clamps employ avalanche diodes such as zener diodes to provide the bias voltage for the it base of a subsequent power bipolar junction transistor (BJT).

Grounded gate NMOS devices (GGNMOS) have also been used as ESD protection devices. However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better. One possible ESD protection solution is to use a silicon-controlled rectifier (SCR).

A silicon-controlled rectifier (SCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. As a result of these characteristics, SCRs have been used to provide ESD protection. When used for ESD protection, the first node becomes a to-be-protected node, and the second node is typically connected to ground. The SCR operates within an ESD protection window that has a maximum voltage defined by the destructive breakdown level of the to-be-protected node, and a maximum voltage (also known as a latch-up voltage) defined by any dc bias on the to-be-protected node.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body discharge occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node.

FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. The n+ and p+ regions 114 and 116 are both connected to a to-be-protected node 120. As further shown in FIG. 1, SCR 100 also has a n+ region 122 and a p+ region 124 formed in semiconductor material 110. The n+ and p+ regions 122 and 124 are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

One of the advantages of SCR 100 over other ESD protection devices, such as a grounded-gate MOS transistor, is the double injection provided by n+ region 122 and p+ region 116 of SCR 100. With double injection, SCR 100 provides current densities (after snapback) that are about ten times greater than the densities provided by a grounded-gate MOS device.

One of the disadvantages of SCR 100, however, is that a very large positive voltage, e.g., 50 volts, must be dropped across nodes 120 and 126 before the junction between p-type material 110 and n-well 112 breaks down. As a result, SCR 100 can not be used to protect devices, such as MOS transistors, that can be permanently damaged by much lower voltages, e.g., 15 volts.

One solution proposed in the past, was to use low voltage silicon controlled rectifiers (LVTSCRs) which are not only smaller but allow the reaching of current densities, after snap back, that are some ten times higher than the current densities of traditionally used grounded gate NMOS devices (GGNMOS), thus increasing the ESD protection capability for CMOS circuits.

An LVTSCR incorporates a NMOS transistor into SCR 100. FIG. 2 shows a cross-sectional diagram that illustrates a conventional LVTSCR 200. LVTSCR 200 and SCR 100 are similar and, as a result, utilize the same reference numerals to designate the structures that are common to both devices.

As shown in FIG. 2, LVTSCR 200 differs from SCR 100 in that LVTSCR 200 has a n+ (drain) region 230 that is formed in both material 110 and n-well 112, and a channel region 232 that is defined between n+ (source) region 122 and n+ (drain) region 230. In addition, LVTSCR 200 includes a gate oxide layer 234 that is formed on material 110 over channel region 232, and a gate 236 that is formed on gate oxide layer 234. N+ (source and drain) regions 122 and 230, gate oxide layer 234, and gate 236 define a NMOS transistor 238 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 238 is formed to be identical to the to-be-protected MOS transistors, the junction between n+ region 230 and material 110 breaks down at the same time that the to-be-protected MOS transistors experience junction break down as a result of an ESD pulse. Once the reverse-biased junction between region 230 and material 110 breaks down, the break down triggers LVTSCR 200 to operate the same as SCR 100.

Since junction break down occurs before the MOS transistors experience destructive gate oxide break down, LVTSCR 200 turns on before destructive gate oxide breakdown occurs, thereby protecting the MOS transistors. Thus, the junction breakdown voltage, which is less than the voltage level that causes destructive gate oxide break down, functions as the trigger voltage. In addition, other techniques, such as reducing the width of channel region 232, can be used to lower the trigger voltage so that the region 230 to material 110 junction breaks down before the to-be-protected MOS transistors experience junction breakdown.

Thus, LVTSCR 200 provides a SCR with a significantly lower turn-on voltage that allows MOS transistors to be protected from ESD events with an SCR. However, one disadvantage of LVTSCR 200, and, for that matter, any SCR is that it suffers from a holding voltage that is often less than the minimum (or latch-up) voltage of the ESD protection window. The low holding voltage of the LVTSCR which lies in the range of less than two volts, is due to the double junction injection of its conductivity modulation mechanism. While the p+ emitter allows one to define how many holes are injected, the injection of the holes leads to greater space charge neutralization and thus a lower holding voltage. As a result, standard LVTSCRs are unattractive candidates for providing ESD protection to power supply pins.

As mentioned above, the major requirement when designing ESD protection circuits, is that the circuit operate within a so-called "ESD protection window" that is usually limited by both the maximum voltage in the protected line (which is related to the breakdown of the protected circuits) and the latch-up voltage when the DC bias is presented in the protected line.

In the LVTSCR, when the minimum (or latch-up) voltage of the ESD protection window is equal to a dc bias, such as the power supply voltage, LVTSCR 200 cannot turn off (thus latching up) after the ESD event has passed. Thus, power must be cycled after the ESD event, to switch off the LVTSCR.

For example, assume that node 120 is a power supply pin at 3.3 volts, node 126 is a ground pin, the junction breakdown voltages of the to-be-protected MOS transistors are 0.7 volts, and the holding voltage is 1.8 volts. In this example, LVTSCR 200 is turned off under normal operating conditions when the voltage on node 120 is 3.3 volts. When the voltage on node 120 spikes up to a value equal to or greater than the trigger voltage (7 volts in this example), LVTSCR 200 turns on, thereby protecting the MOS devices that receive power from node 120. However, once the ESD event has passed, since the normal operating voltage on node 120 is 3.3 volts, and it takes only 1.8 volts on node 120 to keep LVTSCR 200 in this example turned on, LVTSCR 200 remains turned on (latched up) after the ESD event has passed.

Thus, in spite of higher current availability from an LVTSCR after snap back, conventional CMOS integrated circuits are usually protected by grounded gate NMOS snap back structures (GGNMOS) due to the latch-up limitations of LVTSCRs.

What is needed is a device that fills the void between low current GGNMOS devices and low holding voltage, high current SCR and LVTSCR devices.

SUMMARY OF THE INVENTION

The present invention provides an LVTSCR-like structure having an increased holding voltage.

Further, according to the invention, there is provided a LVTSCR-like ESD protection structure with a two-stage snapback triggering characteristic. The present invention seeks to increase the holding voltage by reducing the carrier injection from the p+ emitter region. This is achieved by effectively reversing the locations of the p+ emitter and n+ drain regions. The emitter is located outside the drain region so that at least part of the drain contact region lies between the gate and emitter region. The n+ drain region is typically split to comprise a floating n+ region and a n+ contact region. The structure may include multiple emitters outside the drain region.

Further according to the invention, there is provided a method of reducing local heating in a LVTSCR-like structure, comprising splitting the n+ drain region between a floating n+ region near the gate and a n+ contact region, wherein at least part of the n+ drain region is formed between the p+ emitter and the gate of the structure. Preferably the p+ emitter comprises a plurality of emitter regions.

Still further, according to the invention, there is provided a high holding voltage LVTSCR-like structure, comprising an emitter located so that at least part of the drain region is located between the gate and emitter region. Preferably, the n+ drain region is split into at least one first drain region located near the gate, and at least one second drain region, wherein first drain region may comprise a floating n+ region, and the second drain region may comprise a n+ contact region. The emitter may comprise a plurality of emitter regions, and the first and second drain regions are preferably separated by a shallow trench isolation region.

BRIEF DESCRIPTION OF THE DRAWINGS

FIG. 4 is a cross-sectional view of another embodiment of the structure of the invention;

FIG. 5 is a plan view of yet another embodiment of the invention;

FIG. 6 is a plan view of yet another embodiment of the invention;

FIG. 7 is a plan view of yet another embodiment of the invention;

DETAILED DESCRIPTION OF THE INVENTION

Figure 1:
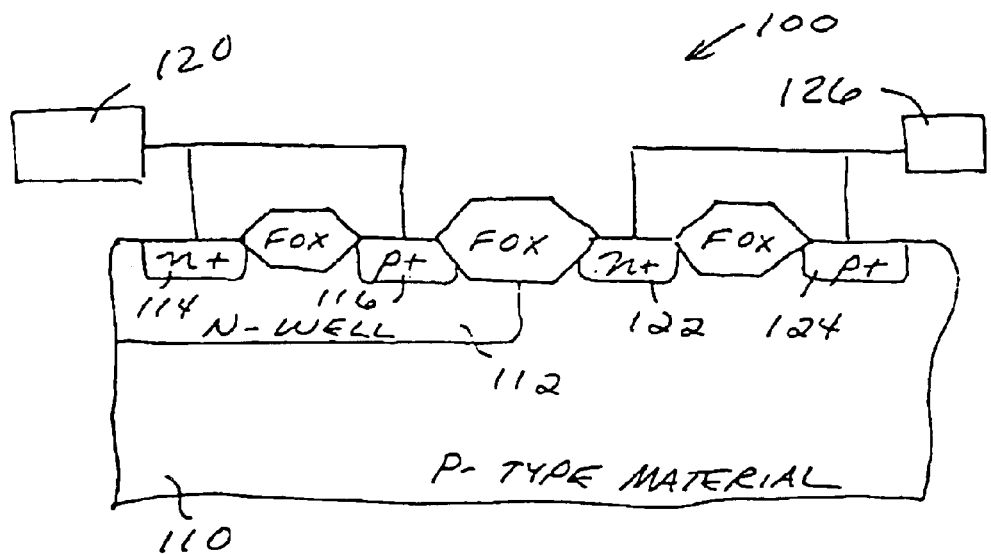
FIG. 1 is a cross-sectional view illustrating a conventional SCR.
Figure 2:
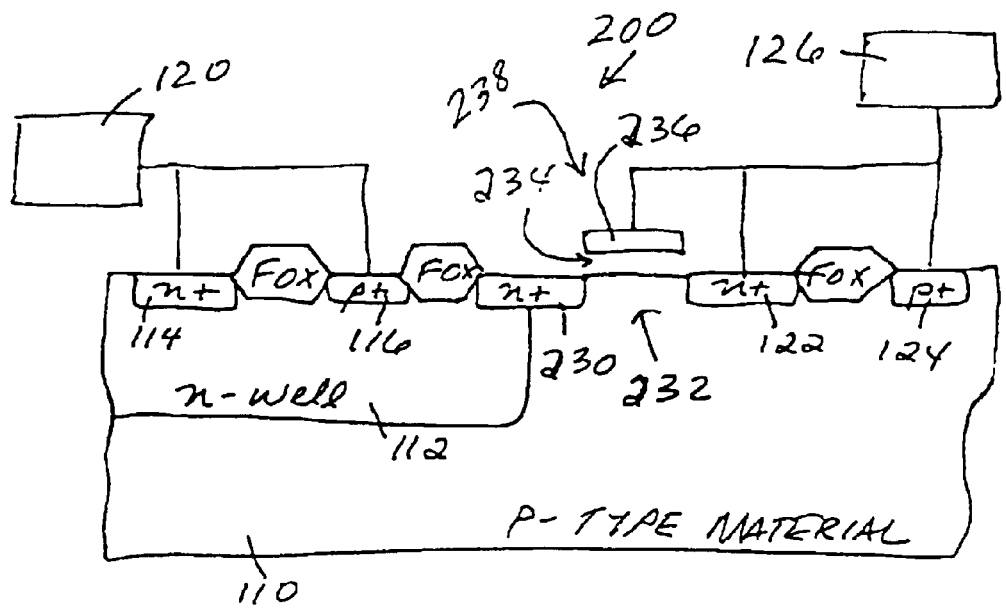
FIG. 2 is a cross-sectional view illustrating a conventional LVTSCR.
Figure 3:
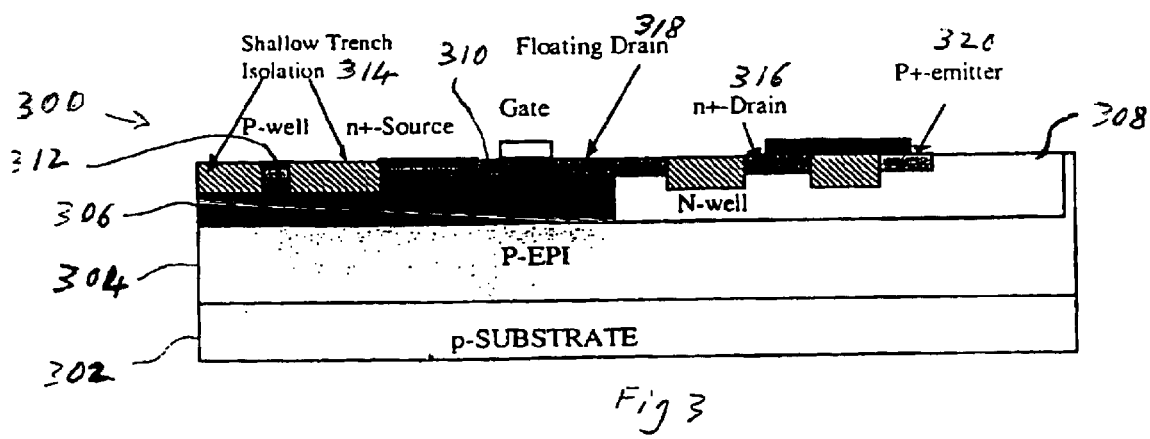
FIG. 3 is a cross-sectional view of one embodiment of a LVTSCR-like structure of the invention.

FIG. 3 shows one embodiment of a LVTSCR-like structure 300 of the invention. As in the case of a conventional LVTSCR, the device 300 includes a p-substrate 302 with a p-epitaxial layer 304 formed on top of the p-substrate 302. A p-well 306 and an n-well 308 are formed in the epitaxial layer 304. Formed in the p-well 306 is a n+ source 310. The p-well 306 further includes a p+ well 312 formed between shallow trench isolation regions 314. The n-well 308 has a n+ drain region 316 formed in it and a floating drain 318 which bridges the junction between the p-well and the n-well 308. In contrast to the prior art LVTSCR, the present structure includes a p+ emitter 320 formed outside the drain region 316, 318. Thus, the drain regions 316, 318 block some of the space charge injected by the p+ emitter 320. The low holding voltage of a conventional LVTSCR can be ascribed to the double injection conductivity modulation mechanism as described above, in which holes are injected from the p+ emitter of a PNP transistor defined by the p+ emitter, the n-well and the p epitaxial layer. The second injection comes from electrons injected from the emitter of an NPN transistor defined by the n+ source, the p-well, and the n-well. In the present invention, the injection of holes from the p+ emitter 320 is delayed due to the emitter 320 lying outside the drain region 316, 318. The effect of this is that the emitter injection turns on only after a sufficiently high critical current density is reached. As a result, the holding voltage of the structure 300 corresponds substantially to that of a snapback NMOS structure. Nevertheless, it still retains characteristics of a LVTSCR insofar as the emitter injection finally turns on to provide a higher current in the saturation region. This also has the effect of dissipating heat more effectively. In contrast, a NMOS device which includes a narrow channel region, produces a high electric field with correspondingly high heat dissipation in a gap of approximately 0.5 $\mu$m.

It will be appreciated that the invention can be implemented in a variety of ways without departing from the scope of the invention. FIG. 4 illustrates another embodiment of the invention in which the p+ emitter 400 is located between two n+ drain portions 402. The n+ drain regions may take the form of continuous drain regions such as those illustrated in the plan view of FIG. 5 and indicated by reference numeral 500. It will be appreciated that the embodiment of FIG. 5 does not show the n+ drain portion outside the p emitter 502. Thus it is a slightly different embodiment but also displays the concept of providing a drain region 500 between the p emitter 502 and the gate 504. As shown in FIG. 4, the p+ emitter 400 is located between two shallow trench isolation regions 404, 406. Similar trench isolation regions are indicated in FIG. 5 by reference numerals 504, 506. Like the STI 408, this embodiment includes a STI region 508 that splits the drain into the drain contact region 500 and the floating drain region 510. As discussed below, this provides for better heat dissipation. A solid drain region would cause excessive avalanche injection and local overheating.

Yet another embodiment of the invention is illustrated in FIG. 6 in which the p+ emitters 600 are formed as isolated islands in a shallow trench isolation region 602. Thus the p+ emitters 600 are effectively placed between shallow trench isolation portions much as the p+ emitter 400 is located between the shallow trench isolation regions 404, 406. The drain 604 is located between the shallow trench isolation regions 602 and a shallow trench isolation region 606, much as the drain 402 in FIG. 4 is located between the shallow trench isolation region 404 and a shallow trench isolation region 408.

Yet another embodiment of the invention is illustrated in FIG. 7. In this embodiment, the p+ emitters 700 are also formed as individual islands. However, in this embodiment, the p+ emitter islands 700 are formed in the n+ drain 702, which is formed between shallow trench isolation regions 704, 706. As can be seen in all of the embodiments, the drain region is split into a n+ drain and a floating drain. In FIG. 3, the floating drain is indicated by reference numeral 318, while in FIGS. 4, 5, 6, 7, the floating drain is indicated by reference numerals 410, 510, 610, 710, respectively.

It will be appreciated that the p+ emitter 400 need not be a continuous emitter as in the embodiment of FIG. 5, but could equally well be formed as individual islands as indicated in the embodiments of FIGS. 6 and 7. Thus, the p+ emitter can take the form of one or more emitter regions which are located outside at least part of the drain region.

Figure 8:
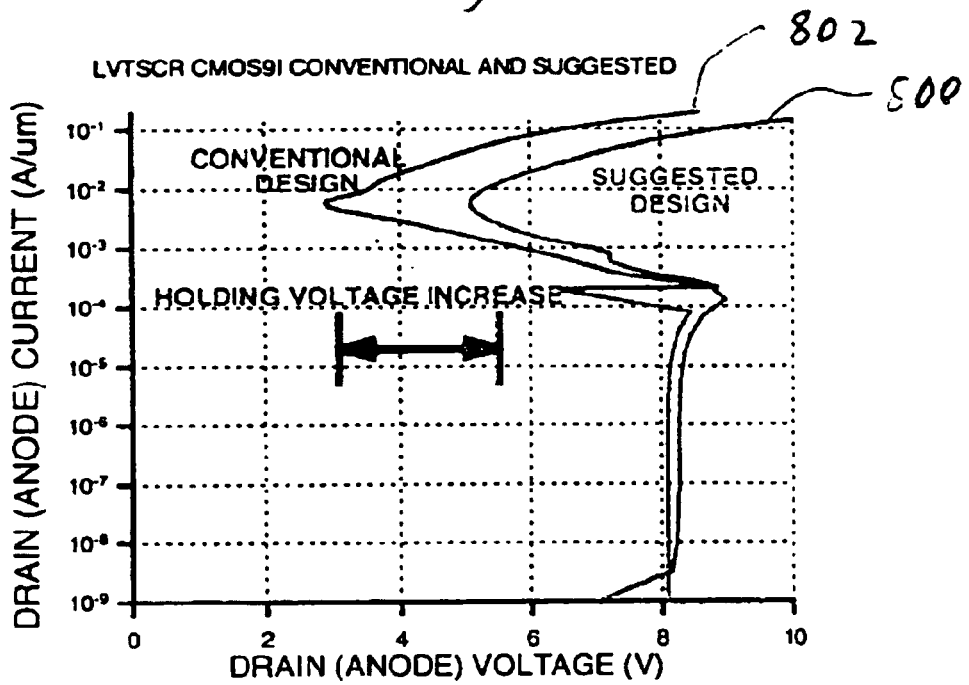
FIG. 8 shows drain current against drain voltage curves for a conventional LVTSCR and an embodiment of a LVTSCR-like structure of the invention.

The marked effects on the holding voltage of the present invention structure are evident in FIG. 8 which shows the drain current against drain voltage curve 800 of one embodiment of the invention as compared to the drain current against drain voltage curve of a conventional LVTSCR as indicated by reference 802. The curve 800 displays a latch-up voltage of about 4.5 V compared to a latch-up voltage of about 2.5 for a conventional device.

Figure 9:
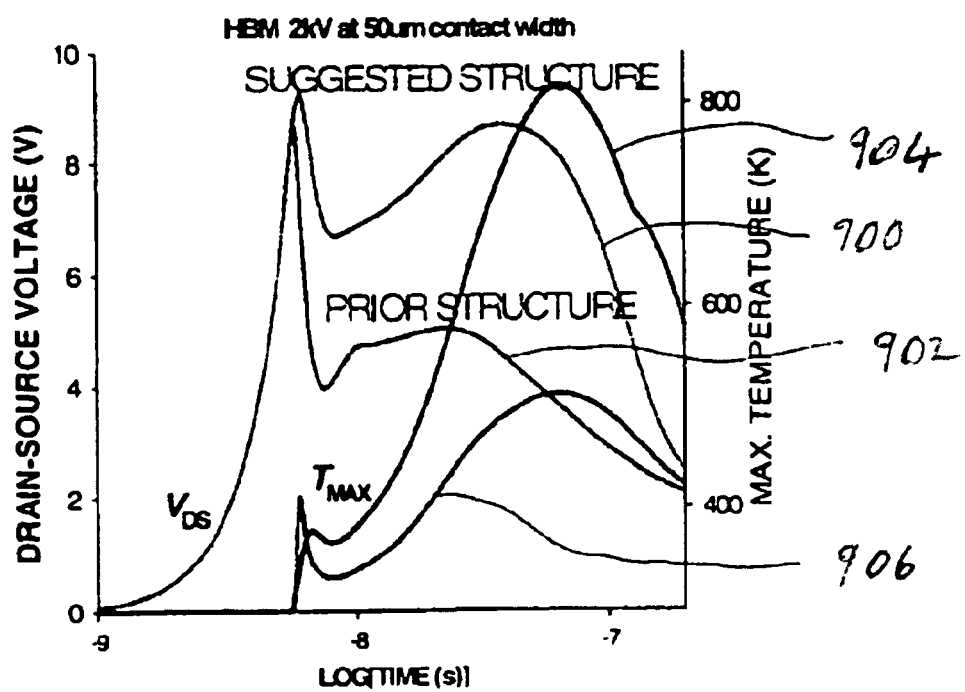
FIG. 9 shows drain-source voltage as well as lattice temperature curves against log time for a conventional LVTSCR device and one embodiment of a LVTSCR-like structure of the invention.

The effects on drain-source voltage and lattice temperature in response to a human body model (HBM) pulse of 2 kV for a 50 μm contact width is illustrated in FIG. 9 for a conventional device and a device of the invention. Curve 900 shows the voltage curve for a device of the invention which shows much higher voltage handling capabilities over time than the conventional device, as indicated by reference 902. The temperature profile of the device of the invention, as illustrated by the curve 904, shows higher temperatures as compared to the curve 906 of the conventional device. However, as discussed below, STI separation of the drain into a n+ contact region and a floating n+ region, causes the temperature to be distributed over a large area, thereby avoiding local overheating.

Figure 10:
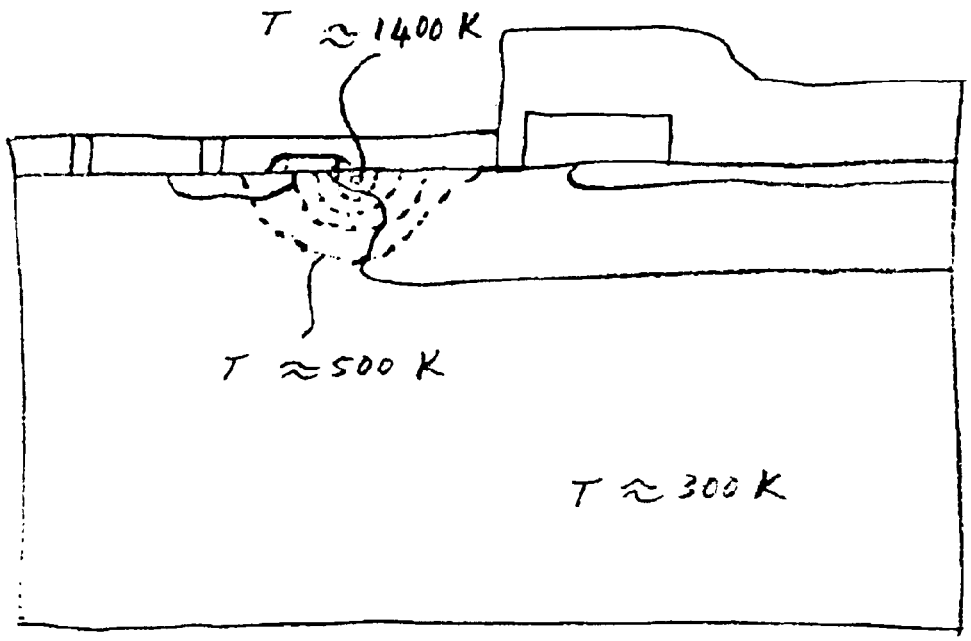
FIG. 10 shows the temperature distribution across a LVTSCR without a STI region splitting the drain.
Figure 11:
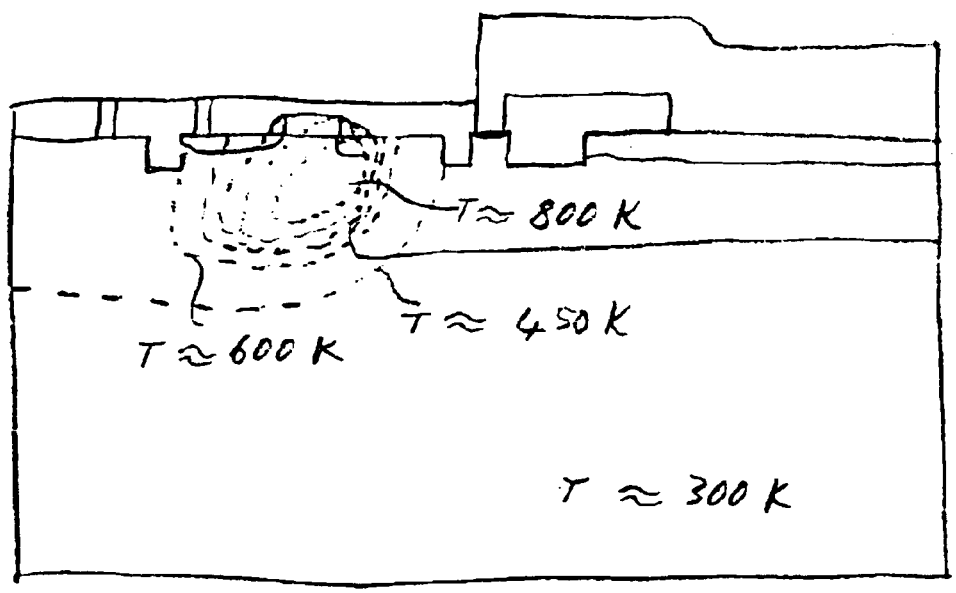
FIG. 11 shows the temperature distribution across one embodiment of a LVTSCR-like structure of the invention.

The embodiments of the present invention include a shallow trench isolation (STI) region between the n+ drain and the floating drain. The effect of this is to provide more efficient heat dissipation as illustrated in the temperature profile for a device without STI separation, as illustrated in FIG. 10, compared to the temperature profile of an embodiment of the invention having STI separation, as illustrated in FIG. 11. A 2 kV HBM pulse was applied and the temperature profile determined after 12 ns.

What is claimed is:

1. A high holding voltage LVTSCR-like structure, comprising
   an emitter formed in an n-well,
   a gate,
   a drain contact region formed in the n-well and split into at least one first drain portion and at least one second drain portion, and
   a floating drain, wherein the emitter is located so that at least the first drain portion of the drain contact region is located between the gate and the emitter,
   and at least the second drain portion is located on the other side of the emitter.

2. A structure of claim 1, wherein the emitter comprises a plurality of emitter regions.

3. A structure of claim 1, wherein the floating drain and drain contact region are separated by a shallow trench isolation region.

4. A LVTSCR-like ESD protection structure, comprising
   a drain contact region formed in at least two parts in an n-well,
   a p+ emitter formed in the n-well, and
   a gate, wherein part of the drain contact region is located between the p+ emitter and the gate and part of the drain contact region is formed on the other side of the emitter.

5. A structure of claim 4, further comprising a floating drain located between the gate and the p+ emitter.

6. A structure of claim 4, wherein the structure includes multiple emitters formed in the n-well and located outside at least part of the drain contact region.

* * * * *